(12) United States Patent
Ueki

(10) Patent No.: US 6,320,893 B1
(45) Date of Patent: Nov. 20, 2001

(54) SURFACE EMITTING SEMICONDUCTOR LASER

(75) Inventor: Nobuaki Ueki, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/132,699

(22) Filed: Aug. 12, 1998

(30) Foreign Application Priority Data

Aug. 15, 1997 (JP) .................................... 9-220497
Jun. 16, 1998 (JP) .............................. 10-1680183

(51) Int. Cl.⁷ .................................................. H01S 3/08
(52) U.S. Cl. ................... 372/96; 372/96; 372/45; 372/46; 372/50; 372/92
(58) Field of Search .............................. 372/96, 75, 43, 372/45, 46, 50, 92

(56) References Cited

U.S. PATENT DOCUMENTS

| | | | |
|---|---|---|---|
| 5,068,868 | * 11/1991 | Deppe et al. ........................ | 372/45 |
| 5,293,392 | 3/1994 | Shieh et al. . | |
| 5,295,150 | * 3/1994 | Vangieson et al. ................... | 372/96 |
| 5,351,256 | 9/1994 | Schneider et al. . | |
| 5,493,577 | * 2/1996 | Choquette et al. ................... | 372/46 |
| 5,557,627 | * 9/1996 | Schneider, Jr. et al. ............ | 372/46 |
| 5,594,751 | 1/1997 | Scott . | |
| 5,822,356 | * 10/1998 | Jewell .................................... | 372/98 |
| 5,985,686 | * 11/1999 | Jayaraman ........................... | 438/32 |
| 5,991,326 | * 11/1999 | Yuen et al. ........................... | 372/96 |
| 6,046,065 | * 4/2000 | Goldstein et al. ................... | 438/46 |
| 6,052,398 | * 4/2000 | Brillouet et al. .................... | 372/46 |

FOREIGN PATENT DOCUMENTS

| | | |
|---|---|---|
| A-5-175615 | 7/1993 | (JP) . |
| A-6-69585 | 3/1994 | (JP) . |

OTHER PUBLICATIONS

H.C. Casey, Jr. and M.B. Panish, "Heterostructure Lasers Part A: Fundamental Principles", pp. 42–47.*

B.J. Thibeault et al., *Reduced Optical Scattering Loss In Vertical–Cavity Lasers Using a Thin (300 Å) Oxide Aperture*, IEEE Photonics Technology Letters, vol. 8, No. 5, pp. 593–595, May 1996.

E.R. Hegblom et al., *Vertical Cavity Lasers with Tapered Oxide Apertures for Low Scattering Loss*, Electronics Letters, vol. 33, No. 10, pp. 869–871, May 1997.

K. D. Choquette et al., *Scalability of Small–Aperture Selectively Oxidized Vertical Cavity Lasers*, Appl. Phys. Lett., 70 (7), pp. 823–825, Feb. 1997.

* cited by examiner

Primary Examiner—Frank G. Font
Assistant Examiner—Delma R. Flores Ruiz
(74) Attorney, Agent, or Firm—Oliff & Berridge, PLC

(57) ABSTRACT

A surface emitting semiconductor laser having the stable transverse mode, reduced threshold current, and high output is provided. The surface emitting semiconductor laser has a structure that top and bottom spacer layers are formed on both sides of an active layer and top and bottom reflection layers are formed on the top side of the top spacer layer and the bottom side of the bottom spacer layer respectively, wherein the surface emitting semiconductor has optical confinement layers provided on one or both contact surfaces between the top and bottom spacer layers and the top and bottom reflection films, the optical confinement layers comprise a semiconductor layer having a thickness of 100 nm or less formed on the entire surface excepting the light emission area, which semiconductor layer consists of a material having a lattice constant similar to the one of the material of the top and bottom spacer layer and the one of the material of the top and bottom reflection films and having the refractive index slightly smaller than the effective refractive index of the material of the top and bottom spacer layers and the material of the top and bottom reflection films.

21 Claims, 14 Drawing Sheets

SURFACE EMITTING SEMICONDUCTOR LASER

BACKGROUND OF THE INVENTION

1. Field of the Invention

This invention relates to a surface emitting semiconductor laser (referred to as surface emitting laser hereinafter) used as a light source for optical information processing and optical communication, a light source of image processing devices using light, and a light source of electrophotographic copy machines, and more particularly relates to a surface emitting semiconductor laser whose transverse mode is stable, threshold current is small, and output is high.

2. Description of the Related Art

Recently, surface emitting semiconductor lasers, which are used easily for structuring a two-dimensional array, have attracted attentions in optical communication or optical interconnection technical field. Among surface emitting semiconductor lasers, the vertical cavity surface emitting laser (referred to as VCSEL hereinafter), the basic structure of which is manufactured through an integrated semiconductor process, is now being developed for practical application because it is suitable for fabrication of large scale wafers. In the VCSEL, the threshold current is reduced relatively easily by narrowing the emission area (light emission area), therefore the VCSEL is advantageous in that power consumption is reduced in the field of optical switching devices which require simultaneous parallel driving of many elements.

However, in the surface emitting semiconductor laser, it is difficult to increase the output because of small volume of the active area. Currently, multi-mode optical fiber, which is supplied at low cost, is used for optical communication, however, single mode optical fiber will be used mainly in the future because the number of lines is increased greatly. The single mode optical fiber needs the single mode laser to be used together, and the single mode laser is required to be developed.

However, the surface emitting laser is involved in a trade-off problem that if the transverse mode stability is increased, the threshold current increases to result in poor response characteristics or low output, and the surface emitting semiconductor laser which satisfies all the requirements has not been realized.

For example, the proton injection surface emitting laser having the gain waveguide structure, from which stable transverse mode oscillation is easily obtained, causes the slight effective refractive index difference between the current passage area and the peripheral area of the current passage area due to the thermal lens effect to result in weak optical confinement condition, therefore stable transverse mode is obtained event though the diameter of a non-proton injection area (current passage) is enlarged to approximately 10 $\mu$m. However, because of weak optical confinement, limited emission efficiency improvement, and significant heat generation, the threshold current is relatively high and response characteristics are poor under the condition without bias.

To cope with this problem, recently the selective oxidation type surface emitting laser having the refractive index waveguide structure has been developed. The selective oxidation type surface emitting laser has a refractive index waveguide passage formed by selective oxidation of a portion of a semiconductor multilayer reflection film adjacent to an active layer, this structure brings about current narrowing effect and strong optical confinement effect, and the threshold current of sub-milliampere order is easily obtained and prompt response characteristics are obtained. However, because the optical confinement effect is significant, the diameter of an emission area should be reduced to 5 $\mu$m or smaller in order to stabilize the transverse mode, therefore it is difficult to increase output.

It is reported that the effective refractive index difference of approximately 0.015 between a light emission area and the peripheral area of the light emission area is effective to realize the surface emitting laser which has a large light emission area, emits high output, and has stable transverse mode.

In the above-mentioned selective oxidation type surface emitting laser, the refractive index difference between a selectively oxidized layer (for example, a layer of oxide of AlAs) and a spacer layer (for example, $Al_{0.5}Ga_{0.5}As$ layer) is large. For example, in the case of the above-mentioned materials, the refractive index of the former AlAs oxide layer is approximately 1.6 and the refractive index of the latter $Al_{0.5}Ga_{0.5}As$ layer is approximately 3.35, therefore the refractive index difference between these materials is 1.8. As the result, great optical confinement effect is brought about between the selectively oxidized layer and the spacer layer.

To achieve the above-mentioned condition, an optical confinement layer formed of a material having a refractive index somewhat larger than the one of the selectively oxidized layer (the refractive index larger than the one of the selectively oxidized layer and smaller than the one of the spacer layer) may be provided on the peripheral area of the light emitting area instead of the selectively oxidized layer.

The surface emitting semiconductor laser disclosed in Japanese Published Unexamined Patent Application No. Hei 6-69858 is an example of the surface emitting laser having a structure similar to the structure of the surface emitting laser based on this concept. The disclosed surface emitting laser is described with reference to FIG. 19. A bottom DBR mirror (Distributed Bragg reflector mirror ) 104 composed of laminates of an n-AlAs layer and an n-GaAs layer is formed on an n-GaAs substrate 101, and thereafter a bottom spacer layer 105 composed of an $n-Al_{0.2}Ga_{0.8}As$, a bottom barrier layer 106 composed of an undoped GaAs layer, a top barrier layer 108 composed of an undoped GaAs layer, and a top spacer layer 109 composed of a $p-Al_{0.2}Ga_{0.8}As$ layer are orderly deposited, and additionally an n-InGaP layer with a thickness of 200 nm is formed thereon. The n-InGaP layer is removed from a light emission area using wet-etching to form a current narrowing layer 110 having an aperture 112, which is served as a current passage, then a $p-Al_{0.2}Ga_{0.8}As$ layer 113 is formed to a sufficient thickness for obtaining the flat surface on the top spacer layer 109 exposed to the aperture 112 and the current narrowing layer 110. The $p-Al_{0.2}Ga_{0.8}As$ layer 113 functions to adjust the distance between the top and bottom resonators (distance from the top surface of the bottom DBR mirror 104 to the bottom surface of the top DBR mirror 116 described hereinafter) to a triple half-wave length of oscillation wavelength $\lambda$. The optical distance from the center of the single quantum well active layer 107 (center plane between the top surface and bottom surface) to the top surface of the bottom DBR mirror 104 is a half of the oscillation wavelength $\lambda$, the thickness is designed so that the amplitude of the standing wave is a maximum at the center of the single quantum well active layer 107. Next, a top DBR mirror 116 composed of laminates of a p-AlAs layer and a p-GaAs layer is formed, and electrodes (not shown in the drawing) is formed on the top surface 115 and the bottom surface to complete the laser.

As mentioned partially hereinabove, the design concept of this surface emitting laser is presumed as described hereunder.

(1) A current is concentrated to the light emission area and the threshold current is reduced because of the current narrowing layer 110.

(2) The material of the current narrowing layer 110 is n-InGaP, the forbidden band width of the layer is larger than the forbidden bandwidth of p-Al$_{0.2}$Ga$_{0.8}$As which is the composition of the above-mentioned spacer layer 109 and the conduction type is reversed, the larger forbidden band width functions to narrow the current and also the reversed conduction type functions similarly in the aspect of energy barrier.

(3) The thickness of the current narrowing layer 110 is made as thick as 280 nm in order to prevent tunneling and to enhance the energy barrier effect.

(4) The optical distance between the center of the single quantum well active layer 107 and the top surface of the bottom DBR mirror 104 is a half of the oscillation wavelength $\lambda$, the antinode of the standing wave is positioned at the center of the single quantum well active layer 107.

(5) Because the refractive index of InGaP which is the material of the current narrowing layer 110 is smaller than the refractive index of Al$_{0.2}$Ga$_{0.8}$As which is the material of the top spacer layer 109, the optical confinement effect is not so significant and this condition complies with the above-mentioned concept.

However, the inventors of the present invention tried to make the surface emitting laser that was disclosed in the Japanese Published Unexamined Patent Application No. Hei 6-69585, and found drawbacks as described hereunder and found that this surface emitting laser was not necessarily excellent.

(1) Because there is the current narrowing layer 110 at the position (the position that is oscillation wavelength $\lambda$ distant from the single quantum well layer 107) where the light intensity is second strongest following the position of the single quantum well layer 107, the light is scattered around the periphery of the aperture of the current narrowing layer 110, and the light confinement effect is insufficient in the vertical direction of the substrate.

(2) The refractive index of GaInP (the material of the current narrowing layer 110) to the laser with an oscillation wavelength $\lambda$ of 980 nm is 3.2 and the refractive index of Al$_{0.2}$Ga$_{0.8}$As (the material of the above-mentioned spacer layer 109) is 3.4, and because the difference is not so large, the structure satisfies the above-mentioned refractive index difference condition, but the thickness of 200 nm of the current narrowing layer 110 is not so small in comparison with the thickness of 578 nm of the p-Al$_{0.2}$Ga$_{0.8}$As layer 113, therefore the optical confinement effect in the horizontal direction of the substrate is large, and if the diameter of the aperture 112 (light emission area) is 5 μm or larger, the transverse mode becomes unstable and the mode changes to multi-mode.

(3) Because the p-Al$_{0.2}$Ga$_{0.8}$As layer 113 having the thickness of 578 nm is formed on the area having a 200 nm step gap due to the aperture 112, the surface is not flat, and actually a recess area is formed on the central area. The recess area causes the film thickness distribution of the top DBR mirror 116 formed thereon to result in reduced reflectance of the DBR mirror, and the characteristics of this surface emitting laser is not so good as desired.

As described hereinabove, in the surface emitting laser disclosed in the Japanese Published Unexamined Patent Application No. Hei 6-69585, the layer of the material having a small refractive index is provided on the periphery of the aperture 112 which functions as a light emission area, it seems to satisfy the above-mentioned conditions apparently, however, it cannot achieve the object of the present invention that the transverse mode is stable, threshold current is small, and the area of the light emission area is large for obtaining a large light output.

An example of the selective oxidation type surface emitting semiconductor laser is disclosed in U.S. Pat. No. 5,594,751. FIG. 20(a) shows a cross sectional structure of a surface emitting laser, and FIG. 20(b) is an enlarged view of the vicinity of an active area. This surface emitting laser has a first electrode 212 on a first mirror stack 214 and a second electrode 216 on a semiconductor substrate 218 positioned under an active area 220 and a second mirror stack 226, the active area 220 composed of a usual InGaAs multilayer quantum well is in contact on both sides with interposition of the electrodes 212 and 216. The first mirror stack 214 serves as a waveguide resonator for restricting the electric field and confines the transverse optical mode 232. The axial mode of the electric field is determined by the film thickness of the active area 220 located between reflection planes of respective mirror stacks, a first contact layer 222, and a second contact layer 224. The current 230 is flowed into the central portion of the resonator by an insulation layer 227. Because the thickness of the insulation layer 227 is sufficiently thin, the transverse optical mode 232 is not limited, the thin thickness allows the transverse optical mode to have a large diameter to result in efficient single transverse mode operation. The insulation layer 227 comprises a semiconductor layer which is formed using selective technique such as wet etching or wet oxidation.

Herein the case in which wet oxidation is used is described, and in the above-mentioned selective oxidation type surface emitting semiconductor laser, the refractive index of the insulation layer (selectively oxidized layer) 227 provided on the first contact layer 222 is approximately 1.6 (aluminum oxide), on the other hand, the refractive index of the original semiconductor layer is as high as 3 to 3.6, and the refractive index difference is very large. Therefore the large refractive index difference causes light scattering on the periphery of the aperture, which is an light emission area, to result in loss of light, and the threshold current increases and the oscillation efficiency decreases.

To reduce the effective refractive index in order to solve such problem, B. J. Thibeault et al. proposed a method in which a thin AlAs film (~30 nm) is used in his article "Reduced Optical Scattering Loss in Vertical-Cavity Lasers Using a Thin (300 Å) Oxide Aperture" (IEEE Photonics Technology Letters, Vol. 8, No. 5, p 593 to 595, 1996), and E. R. Hegblom et al. propose a method in which the end of the selectively oxidized area is formed in taper shape to form lens like refractive index distribution in his article "Vertical Cavity Lasers with Tapered Aperture for Low Scattering Loss" (Electronics Letters, Vol. 33, No. 10, p 869 to 871, 1997). Therefore, in such a surface emitting semiconductor laser, for example, the method in which the insulation layer (selectively oxidized layer) 227 with a thin thickness (<30 nm) is used requires for the thickness of the insulation layer (selectively oxidized layer) 227 to be controlled at the accuracy of several nm order, therefore in consideration of the current selective oxidation technology level, the evenness of film thickness in the horizontal plane of the substrate is insufficient for wafer scale manufacturing of the surface emitting semiconductor laser, and it is difficult to increase the manufacturing yield. In the experience of the inventors of the present invention, it was confirmed that the thin film thickness of an AlAs layer resulted in significantly reduced oxidation rate, and the unevenness of film thickness significantly affected adversely the controllability of the diameter of an aperture formed by oxidation.

On the other hand, the method in which the end of the selectively oxidized area is formed in taper shape is effective to prevent the optical scattering on the peripheral area of the aperture, but it is required for composition and film thickness of the layer to be inserted to be controlled accurately, the requirement leads to troublesome manufacturing process and poor reproducibility. In particular, it is difficult to manufacture surface emitting semiconductor lasers with reduced quality dispersion in wafer scale.

It is an object of the present invention to provide a surface emitting semiconductor laser which is advantageous in that the transverse mode is stable, the threshold current is small, and the area of the light emission area is large for high light output.

It is another object of the present invention to provide a selective oxidation type surface emitting semiconductor laser in which light scattering on the peripheral area of the light emission area is effectively prevented, the threshold current is small, and the emission efficiency is high while the reproducibility and controllability in manufacturing process are maintained excellent.

SUMMARY OF THE INVENTION

In a surface emitting semiconductor laser in accordance with the present invention, the surface emitting semiconductor laser has a top and bottom spacer layers formed on both sides of an active layer, and has a top and bottom reflection films formed on the top surface of the top spacer layer and on the bottom surface of the bottom spacer layer respectively, wherein optical confinement layers having a thickness of 100 nm or less, desirably 10 to 50 nm, and consisting of a material having the effective refractive index slightly smaller than those of the material of the spacer layers and the material of the reflection films are provided between the top spacer layer and the top reflection film and between the bottom spacer layer and the bottom reflection film respectively on the area excepting the area corresponding to the light emission area.

In this case, the effective refractive index difference between the light emission area inside the optical confinement layer and the peripheral area of the light emission area including the optical confinement layer is desirably 0.01 to 0.02, and more desirably 0.013 to 0.017 in the horizontal plane along the active layer.

Because the forbidden band width of the optical confinement layer is larger than that of the material of the spacer layer and functions as a current barrier, it is not necessary to specify the conduction type of the optical confinement layer, if the conduction type of the optical confinement layer is the same as that of the adjacent reflection film, the function as a current narrowing layer is secured. In other words, if the conduction type of the optical confinement layer is differentiated from the conduction type of the top multilayer reflection film, naturally the current narrowing effect is obtained, and similarly if the optical confinement layer having the same conduction type as that of the top multilayer reflection film is used or if the optical confinement layer of undoped semiconductor is used, the current narrowing effect is obtained as well.

The active layer is desirably an undoped AlGaAs base single quantum well layer or multilayer quantum well layer, the top and bottom spacer layers are desirably undoped AlGaAs base semiconductor layer having a forbidden band width larger than the active layer, the top and bottom reflection films are desirably AlGaAs base semiconductor layers of different conduction type respectively from each other for top and bottom reflection films, and the optical confinement layer is desirably a GaInP base semiconductor having a refractive index slightly smaller than the spacer layer.

A surface emitting semiconductor laser in accordance with the present invention have a structure that top and bottom spacer layers are formed on both sides of an active layer and top and bottom reflection layers are formed on the top side of the top spacer layer and the bottom side of the bottom spacer layer respectively provided with optical confinement layers provided on one or both contact surfaces between the top and bottom spacer layers and the top and bottom reflection films, wherein the optical confinement layers consisting of a material having a lattice constant similar to the one of the material of the top and bottom spacer layer and the one of the material of the top and bottom reflection films, and comprising semiconductor layers consisting of the material having the refractive index slightly smaller than the effective refractive index of the material of the top and bottom spacer layers and the material of the top and bottom reflection films are formed on the entire surface excepting the light emission area, and in the horizontal plane along the active layer, effective refractive index differences of at least two steps are provided between the light emission area inside the optical confinement layer and the peripheral area of the light emission area including the optical confinement layer.

As described hereinabove, the surface emitting semiconductor laser having a structure of the effective two-step refractive index difference is realized by applying a method in which the layer adjacent to the active layer is partially oxidized, oxidation for insulation is carried out from the side so that the end of the oxidized area does not penetrate at least into the periphery of the light emission area in the horizontal plane of the substrate.

In this case, the refractive index of the material of the optical confinement layer is desirably larger than the refractive index of the material of the oxidized area which is a portion of the layer adjacent to the active layer, the layer adjacent to the active layer to be oxidized is desirably a portion of the reflection film, and comprises desirably an aluminum-gallium-arsenic layer containing aluminum content of 90% or higher.

If the active layer is adjacent to it, the layer facing the optical confinement layer with interposition of the active layer may be oxidized.

The surface emitting semiconductor laser in accordance with the present invention is structured not only in the form of planer type but also in the form of post type, in detail, the surface emitting semiconductor laser may have a structure in which any one of reflection films is formed in post shape on the light emitting area.

In this case, if AlGaAs base material is used for the reflection film, GaInP base material is used for the optical confinement layer, and an etchant having significantly different etching rate between these materials is used, the manufacturing process becomes easy because the optical confinement layer functions as a stopper layer.

In the structure having the top and bottom spacer layers with interposition of the active layer, the top and bottom reflection films with interposition of the top and bottom spacer layers, and the optical confinement layer or the optical confinement layers provided between the top space layer and the top reflection film (top layer pair) and between the bottom space layer and the bottom reflection film (bottom layer pair) or provided between any one of the top layer pair and bottom layer pair, each optical confinement layer has the lattice constant approximate to the one of both the top and bottom spacer layers and the top and bottom reflection films, and has the refractive index slightly smaller than the effective refractive index of the top and bottom spacer material and the top and bottom reflection film material, and comprises a semiconductor layer having a thickness of 100 nm or less formed on the area excepting the light emission area, the surface emitting semiconductor laser having an effective two step refractive index difference can be realized by applying a method in which the optical confinement layer is partially oxidized, oxidation for insulation is carried out from the side so that the end of the oxidized area does not penetrate at least into the periphery of the light emission area in the horizontal plane of the substrate.

In this case, the refractive index of the material of the optical confinement layer is larger than the refractive index of the material of the oxidized area which is a portion of the optical confinement layer.

The optical confinement layer is desirably formed of a material consisting of an aluminum-gallium-indium-phosphor base compound containing at least gallium, indium, and phosphor.

The surface emitting semiconductor laser in accordance with the present invention is structured not only in the form of planer type but also in the form of post type, in detail, the surface emitting semiconductor laser may have a structure in which either one of reflection films is formed in post shape on the light emitting area, and the side of the post shaped reflection film and the side of the optical confinement film and the top surface of the spacer layer adjacent to the optical confinement layer are covered with an insulation film.

In this case, by using an etchant having significant difference between etching rate for the reflection film material and etching rate for the optical confinement layer material, the manufacturing process becomes easy because the optical confinement layer functions as a stopper layer.

In any surface emitting semiconductor laser in accordance with the present invention, the shape of both or either one of the optical emission area and oxidized area formed on the optical confinement layer is desirably of a tow fold symmetrical shape with respect to the layer plane such as a circle, square, ellipse, and rhomboid.

Instead of oxidation of the portion of the layer adjacent to the active layer or the optical confinement layer, the portion may be removed by etching to provide a space.

Because the refractive index of the optical confinement layer with respect to the laser oscillation wavelength $\lambda$ is smaller than both the refractive index of the material of the spacer and the equivalent refractive index of the material of the multilayer reflection film, the difference in the refractive index causes the effective refractive index difference between the portion with the optical confinement layer and the portion without the optical confinement layer in the vicinity of the active layer. As the result, a refractive index waveguide is formed, the light emitted from the active layer is effectively confined in the horizontal direction of the substrate. However, because the refractive index difference is not so large as in the case of the selectively oxidized laser in which the effective refractive index is generated mainly based on the effect of the selectively oxidized layer, light scattering loss on the peripheral area of the light emission area is reduced.

Further, by applying a method in which the layer adjacent to the active layer is partially oxidized, oxidation for insulation is carried out from the side so that the end of the oxidized area does not penetrate at least into the periphery of the light emission area in the horizontal plane of the substrate, the two-step effective refractive index difference is formed due to the difference between the areas with and without the optical confinement layer and between the areas with and without the selectively oxidized layer in the vicinity of the active layer. By changing the effective refractive index stepwise as described hereinabove, the effective refractive index difference on the peripheral area of the light emission area is reduced to prevent the light diffraction, and light scattering loss is reduced. Therefore, by applying this method, the surface emitting semiconductor laser with reduced threshold current and high emission efficiency is obtained easily.

In the conventional selective oxidation type surface emitting semiconductor laser, because the selectively oxidized layer serves for both optical confinement and current narrowing, optical confinement is too strong and the maximum diameter of the aperture which forms the light emission area is as small as approximately 5 $\mu$m, but in this case, because the selectively oxidized layer which functions as a current narrowing layer is provided separately in addition to the optical confinement layer, and two functions of optical confinement function and current narrowing function are separately allocated to two layers respectively, that is, optical confinement function is exclusively allocated to the optical confinement layer, and current narrowing function is exclusively allocated to the current narrowing layer, even though the large diameter of as large as 10 $\mu$m of the aperture is formed in the optical confinement layer, the transverse mode is maintained stable and light output is increased while the basic transverse mode characteristics are maintained.

Differentiation in conduction type between the optical confinement layer and the top multilayer film allows current narrowing to be effective naturally, and an undoped semiconductor optical confinement layer can give the same current narrowing effect because of a current barrier between the top reflection film and the optical confinement layer due to the difference in forbidden band width.

Use of optical confinement layer material having a high etching selectivity to the material of the top semiconductor multilayer reflection film for forming, for example, the column-like optical control area for current narrowing allows etching operation to be easily depth-controlled, and dispersion of characteristics are reduced and production yield is improved.

Forming both or any one of the light emission area and the oxidized area formed on the optical confinement layer in the form of two fold symmetrical shape with respect to the horizontal plane of the substrate allows the polarization plane of the laser beam to be polarized in the major axis direction all together. It is possible to control the polarization plane of the laser beam in a certain direction by using an aperture of ellipse, elongated circle, or rhomboid shape utilizing this phenomenon.

Further, selection of a material which is susceptible to oxidation as the material of the optical confinement layer allows the optical confinement layer to be changed partially to an insulation layer (selectively oxidized layer), as the result, the optical confinement function and current narrowing function are both realized with the simple structure while the two functions are separated.

DETAILED DESCRIPTION OF THE PREFERRED EMBODIMENTS

A surface emitting semiconductor laser in accordance with the present invention will be described with reference to the drawings.

First Embodiment (Planer type)

Figure 1:
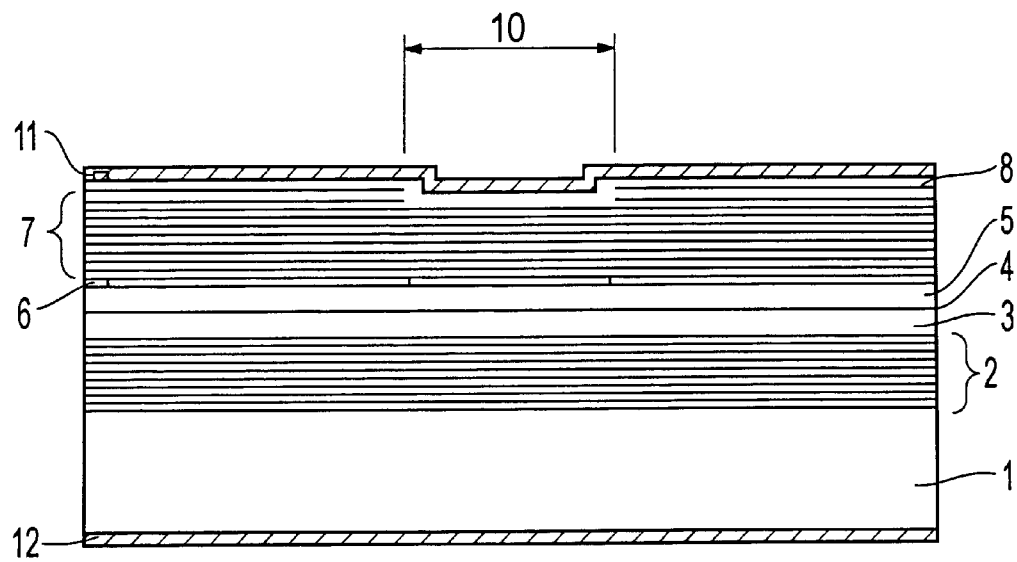
FIG. 1 is a cross sectional view of a planer type surface emitting semiconductor laser in accordance with the first embodiment of the present invention.
Figure 2:
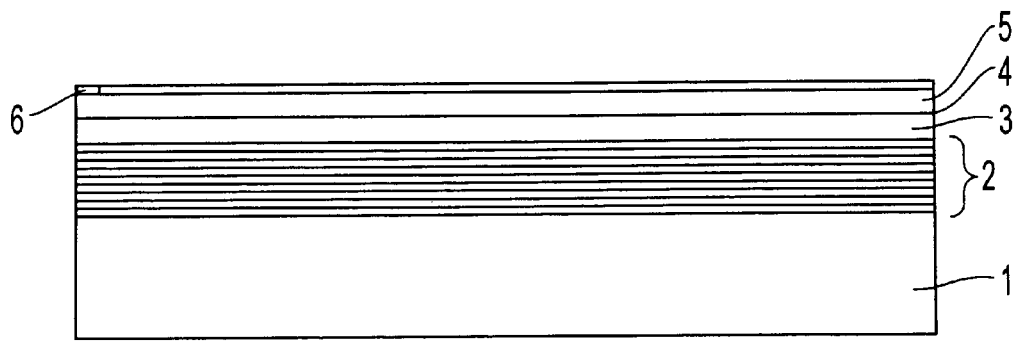
FIG. 2 is a cross sectional view of the planer type surface emitting semiconductor laser in accordance with the first embodiment of the present invention in the manufacturing process.

FIG. 1 is a cross sectional view of a surface emitting semiconductor laser in accordance with the first embodiment. In this embodiment, as shown in FIG. 2, a bottom multilayer reflection film 2 composed of a multilayer laminate of n-type $Al_{0.9}Ga_{0.1}As$ layers and n-type $Al_{0.3}Ga_{0.7}As$ layers, a bottom spacer layer 3 composed of an undoped $Al_{0.5}Ga_{0.5}As$ layer, a quantum well active layer 4 composed of a quantum well layer of an undoped $Al_{0.11}Ga_{0.89}As$ layer and a barrier layer of an $Al_{0.3}Ga_{0.7}As$ layer, a top spacer layer 5 composed of an undoped $Al_{0.5}Ga_{0.5}As$ layer, and an optical confinement layer 6 composed of an n-type $Ga_{0.5}In_{0.5}P$ layer are formed successively on the surface of (100) plane of an n-type GaAs substrate 1 using metalorganic chemical vapor (MOCVD).

The bottom multilayer reflection film 2 comprises the multilayer laminate of n-type $Al_{0.9}Ga_{0.1}As$ layers and n-type $Al_{0.3}Ga_{0.7}As$ layers, the thickness of each layer is $\lambda/4n_r$ ($\lambda$ is an oscillation wavelength, and $n_r$ is a refractive index), and layers with different mixed crystal ratio are laminated alternately to the thickness of 40.5 periods. Carrier concentration is $2 \times 10^{18}$ cm$^{-3}$. (dopant: silicon)

The quantum well active layer 4 comprises three laminates, each laminate comprises alternately a quantum well layer of an undoped $Al_{0.11}Ga_{0.89}As$ layer having a thickness of 8 nm and a barrier layer of an undoped $Al_{0.3}Ga_{0.7}As$ layer having a thickness of 5 nm (however, the both outside layers are formed of undoped $Al_{0.3}Ga_{0.7}As$ layer, therefore the number of barrier layers of undoped $Al_{0.3}Ga_{0.7}As$ layer is four), and a laser oscillation having a wavelength of 780 nm is obtained.

The total film thickness from the bottom surface of the bottom spacer layer 3 to the top surface of the top spacer layer 5 is an integral multiple of $\lambda/n_r$ ($\lambda$ is oscillation wavelength, and $n_r$ is refractive index) so that a standing wave exists between both surfaces, and so that the antinode where the light intensity is at maximum is positioned at the quantum well active layer 4.

The optical confinement layer 6 composed of a n-type GaInP layer has a thickness of as thin as 100 nm or less, however, in order to reduce scattering loss of light which occurs on the periphery of an aperture 10 as described hereinafter, it is required to reduce the thickness as much as possible. But because an excessively thin thickness causes tunneling of carrier to result in reduced current confinement effect, the thickness is desirably 10 to 50 nm.

Figure 3:
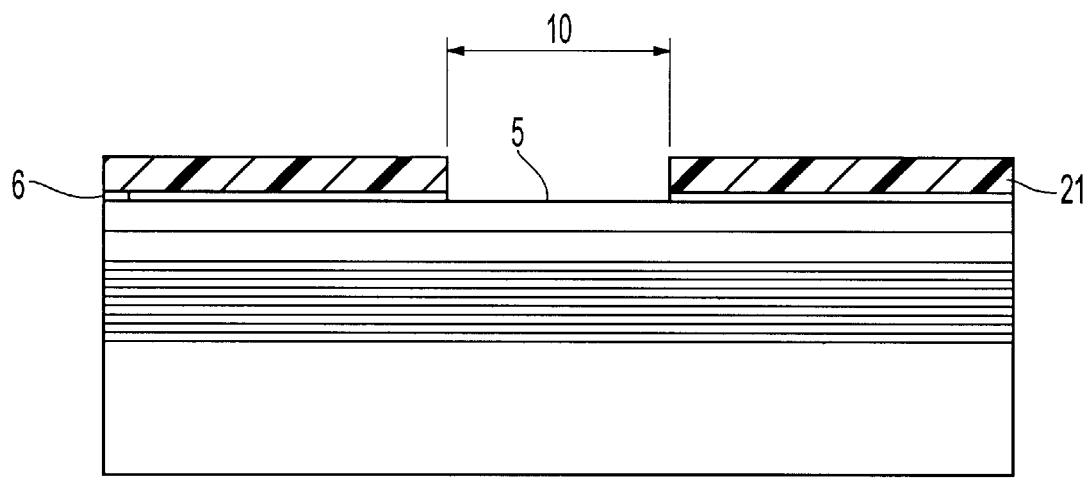
FIG. 3 is a cross sectional view of the planer type surface emitting semiconductor laser in accordance with the first embodiment of the present invention in the manufacturing process.

As shown in FIG. 3, a substrate is taken out from a growing chamber, a photoresist is formed on the entire surface of the substrate, the above-mentioned photoresist film is exposed to light using a photomask (not shown in the drawing) having an aperture having a diameter of 10 μm on the area where a light emission area is to be formed, and the exposed photoresist film is developed to form an etching mask 21.

The light confinement layer 6 composed of an n-type GaInP layer is removed from the light emission area to form the aperture 10 using the etching mask 21 and an etchant composed of a mixed solution of phosphoric acid and hydrochloric acid.

Figures 5A, 5B:
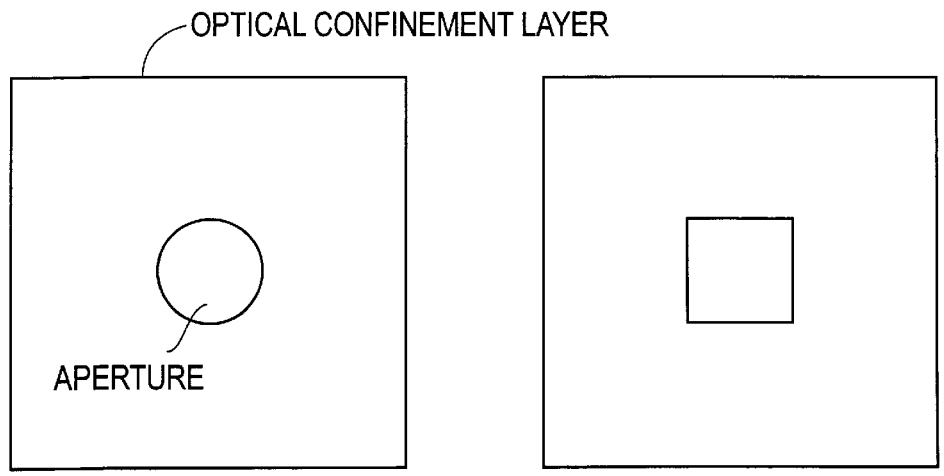
FIG. 5(a) to FIG. 5(e) are diagrams for illustrating the shape of the aperture (light emission area) provided on the optical confinement layer of the planer type surface emitting semiconductor laser in accordance with the first or second embodiment of the present invention.
Figures 5C, 5D:
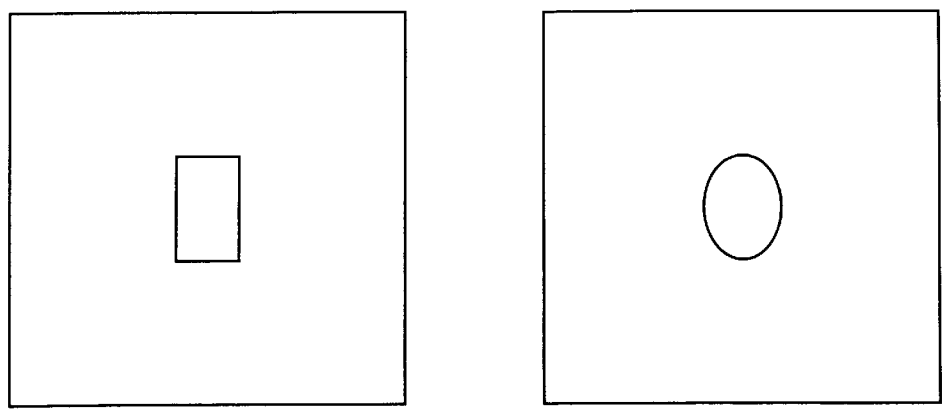
Figure 5E:
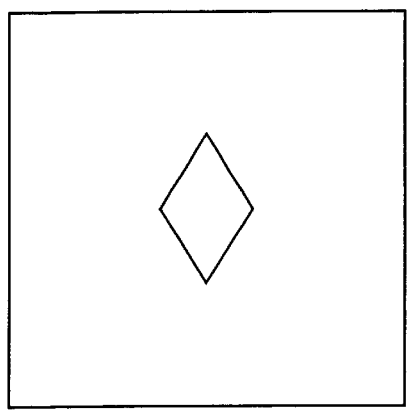

As shown in FIG. 5, the shape of the aperture 10 may be a square, rectangle, ellipse, or rhomboid as well as a circle. Planer shapes of two-fold symmetry (the shape which returns to the original shape by rotating 180 degrees) such as a rectangle, ellipse, and elongated circle allow the plane of polarization of an emitted light to be controlled, therefore the shape of the aperture 10 may be selected depending on the application of the surface emitting semiconductor laser.

Figure 4:
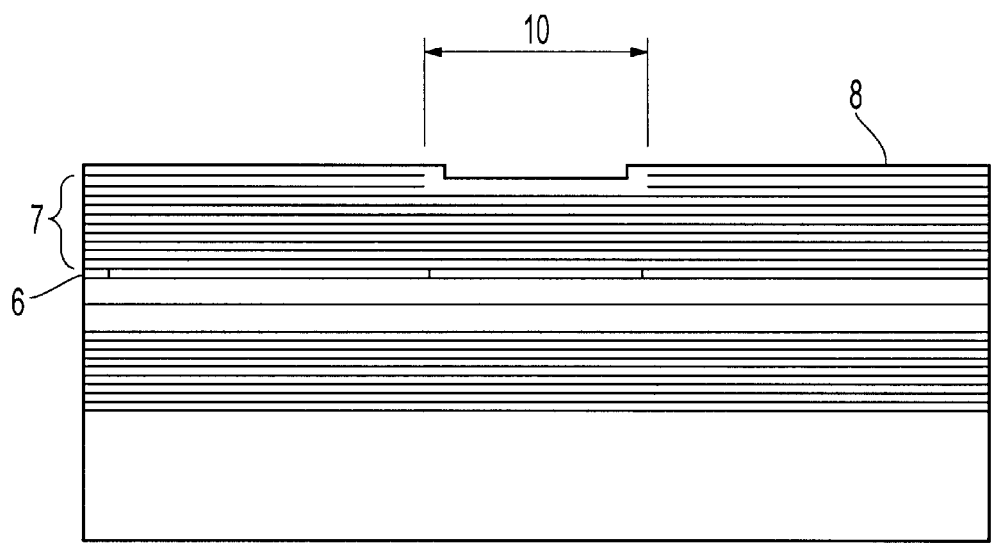
FIG. 4 is a cross sectional view of the planer type surface emitting semiconductor laser in accordance with the first embodiment of the present invention in the manufacturing process.

As shown in FIG. 4, the used photoresist is removed, the substrate is returned to the growing chamber, and a top multilayer reflection film 7 composed of a laminate of p-type $Al_{0.9}Ga_{0.1}As$ layers and p-type $Al_{0.3}Ga_{0.7}As$ layers, and a contact layer 8 composed of a p-type GaAs layer are formed again using the MOCVD method.

In the above description, the top multilayer reflection film 7 comprises a laminate of p-type $Al_{0.9}Ga_{0.1}As$ layers and p-type $Al_{0.3}Ga_{0.7}As$ layers, and the thickness of each layer is $\lambda/4n_r$ ($\lambda$ is oscillation wavelength, and $n_r$ is refractive index), which layers with different mixed crystal ratio are laminated alternately to the thickness of 30 periods. The carrier concentration is $3\times10^{18}$ $cm^{-3}$ (dopant: carbon). The reason why the number of periods of the top multilayer reflection film 7 (the number of layers) is smaller than that of the bottom multilayer reflection film 2 is that an outgoing light is taken out from the top surface of the substrate by differentiating in reflectance. Though it is not described in detail, to reduce the series resistance of the element, so-called intermediate layers having an intermediate mixed crystal ratio between that of an $Al_{0.9}Ga_{0.1}As$ layer and that of an $Al_{0.3}Ga_{0.7}As$ layer are provided between each $Al_{0.9}Ga_{0.1}As$ layer and $Al_{0.3}Ga_{0.7}As$ layer.

The contact layer 8 composed of a p-type GaAs layer has a thickness of 50 Å, and the carrier concentration is $1\times10^{20}$ $cm^{-3}$ (dopant: carbon).

As shown in FIG. 1, the substrate is taken out from the growing chamber, a Cr/Au layer is formed on the contact layer 8 using spattering and removed it on the area of the aperture 10 (light emission area) to form a p-side electrode 11 having a window which emits light upward, and then an n-side electrode 12 composed of an Au-Ge/Ni/Au layer is formed on the back side of the n-type GaAs substrate 1.

Figure 6:
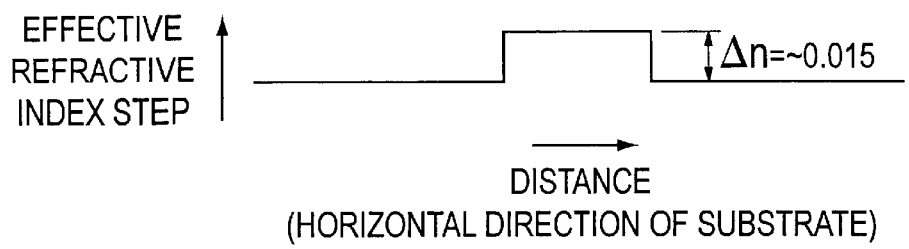
FIG. 6 is a diagram for illustrating the refractive index on the plane of the optical confinement layer of the planer type surface emitting semiconductor laser in accordance with the first embodiment of the present invention.

As shown in FIG. 6, the layer structure on the area corresponding to the aperture 10 (light emission area) comprises the bottom multilayer reflection film 2, the bottom spacer layer 3, the quantum well active layer 4, the top spacer layer 5, and the top multilayer reflection film 7 in the order from the bottom, but the layer structure on the peripheral area of the aperture 10 (light emission area) comprises the bottom multilayer reflection film 2, the bottom spacer layer 3, the quantum well active layer 4, the top spacer layer 5, the optical confinement layer 6, and top multilayer reflection film 7 in the order from the bottom, and the optical confinement layer 6 comprises a GaInP layer. The structure is designed so that an effective refractive index is different by about 0.015 between the refractive index of the area corresponding to the aperture 10 (light emitting area) and the peripheral area of the aperture 10 area. In detail, the film thickness of the optical confinement layer consisting of GaInP is about 50 nm.

Because this effective refractive index difference is a desirable refractive index difference, desirable optical confinement effect is obtained.

Figure 7:
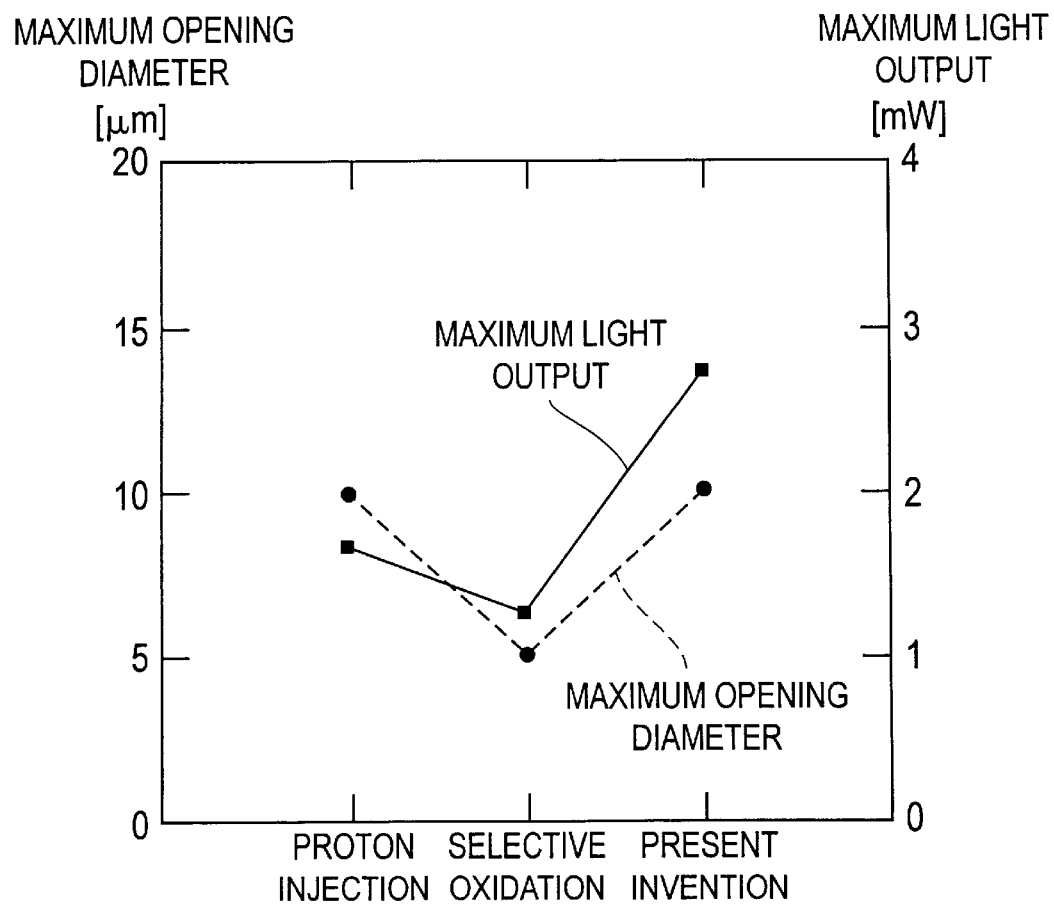
FIG. 7 is a graph for describing the effect confirmation test of the planer type surface emitting semiconductor laser in accordance with the first embodiment of the present invention.

As shown in FIG. 7, in the surface emitting semiconductor laser manufactured as described hereinabove, though a forward direction pn junction is formed on the interface between the p-type multilayer reflection film 7 and the n-type optical confinement layer 6, because the forbidden band gap of the GaInP which is the element of the optical confinement layer 6 is larger than the forbidden band gap of $Al_{0.5}Ga_{0.5}As$ which is the component of the top spacer layer 5 and the optical confinement layer 6 functions as a current barrier, electrons mainly flow into the area corresponding to the aperture 10 and efficiently flow into the quantum well active layer 4. As the result, the threshold current is reduced significantly due to synergistic optical confinement effect. Because optical confinement is low in comparison with a conventional refractive index guide type surface emitting laser, transverse mode is stable even though the diameter of the aperture is expanded up to as wide as 10 μm as shown in FIG. 7, the maximum light output in basic transverse mode is increased greatly.

In the above-mentioned embodiment, the n-type optical confinement layer is used to obtain narrow current effect of the optical confinement layer 6, however, alternatively an undoped optical confinement layer can give sufficient narrow current effect because of the current barrier due to forbidden band width difference.

Types of impurity is not limited to the impurities described hereinabove, other impurities such as selenium for n-type and zinc and magnesium for p-type may be used.

Second Embodiment (Post Type)

Figure 8:
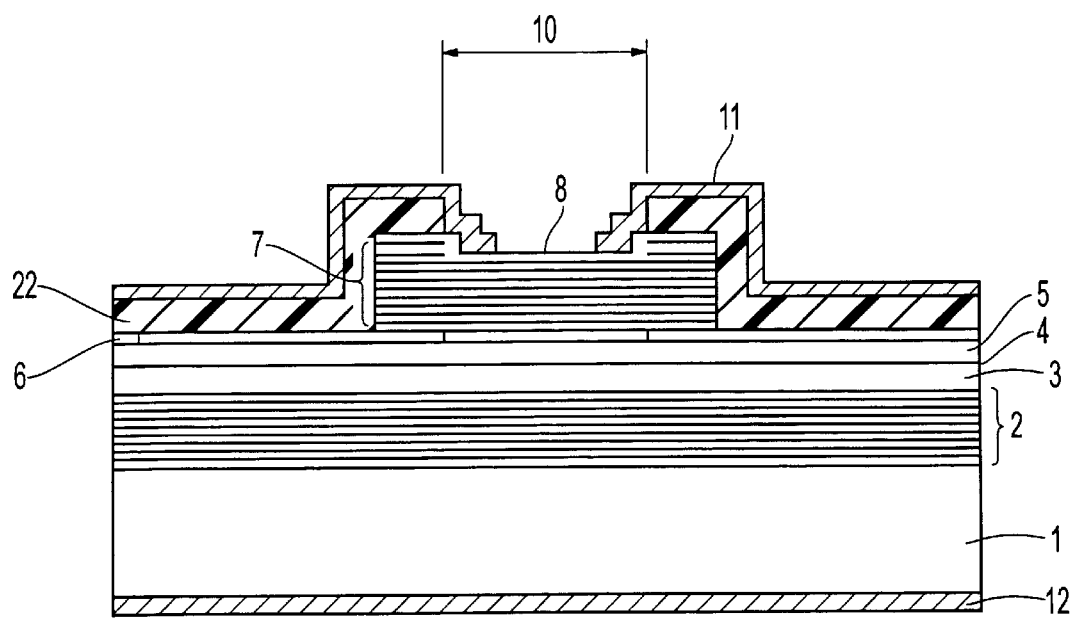
FIG. 8 is a cross sectional view of the surface emitting semiconductor laser in accordance with the second embodiment of the present invention.

FIG. 8 is a cross sectional view of a surface emitting semiconductor laser in accordance with the second embodiment. In this embodiment, the top multilayer reflection film 7 of the surface emitting semiconductor laser in accordance with the first embodiment is etched to leave it in the shape of post on the area surrounding the light emission area 10. In this process, because the AlGaAs which forms the top multilayer reflection film 7 and GaInP which forms the optical confinement layer 6 have an etching selectivity ratio higher than 10:1 to, for example, an etchant of mixed aqueous solution containing sulfuric acid and hydrogen peroxide, the top multilayer reflection film 7 functions as a stopper. Polyimide resin is coated on it to form an insulation film 22, the insulation film is removed from the light emission area, Cr/Au is deposited on it, the deposited Cr/Au is removed from the light emission area to form the p-side electrode 11, and Au-Ge/Ni/Au layer is formed on the back side of the substrate 1 to form the n-side electrode.

In the surface emitting semiconductor laser manufactured as described hereinabove, because the current passage acceptable area is limited to the light emission area, current narrowing effect is significant and the threshold current is low.

Third Embodiment

Figure 9A:
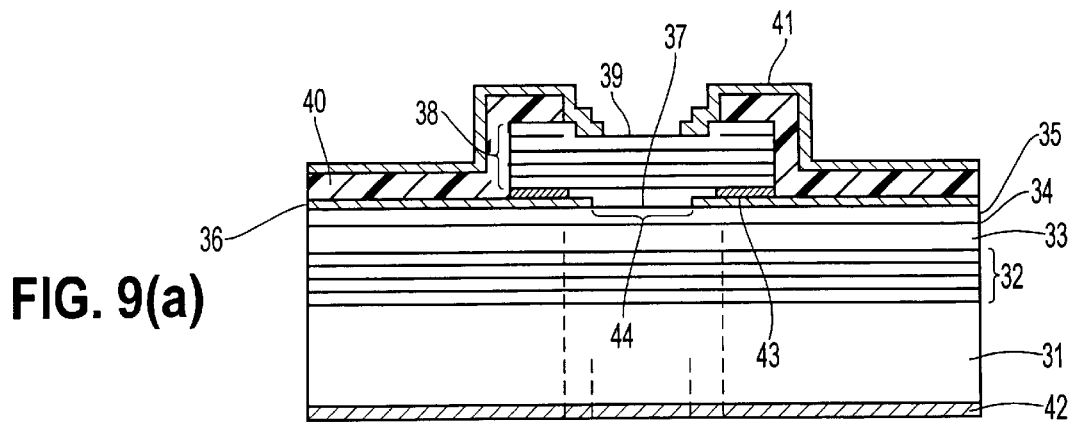
FIG. 9(a) and FIG. 9(b) are cross sectional views of the surface emitting semiconductor laser in accordance with the third embodiment of the present invention.
Figure 14:
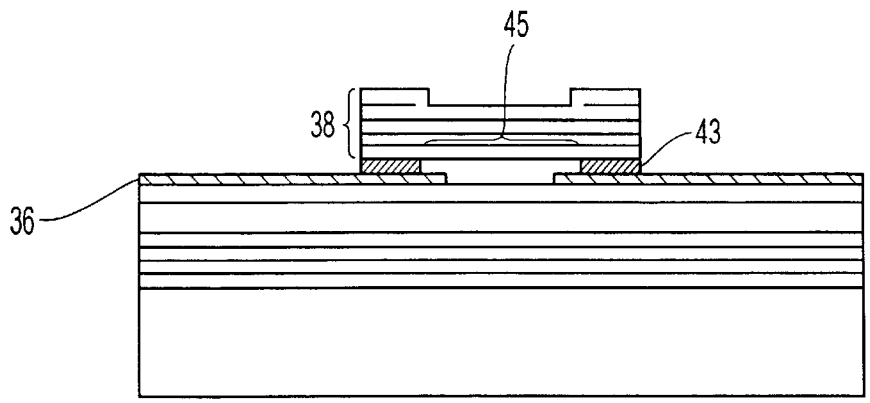
FIG. 14 is a cross sectional view for illustrating the manufacturing process of the surface emitting semiconductor laser in accordance with the third embodiment of the present invention.
Figure 15:
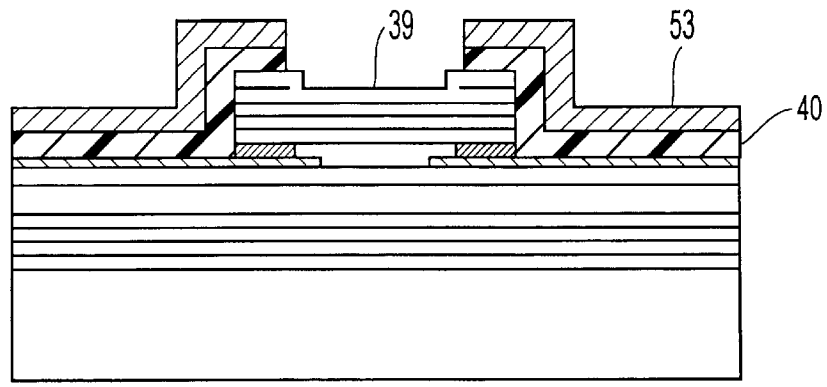
FIG. 15 is a cross sectional view for illustrating the manufacturing process of the surface emitting semiconductor laser in accordance with the third embodiment of the present invention.
Figure 16:
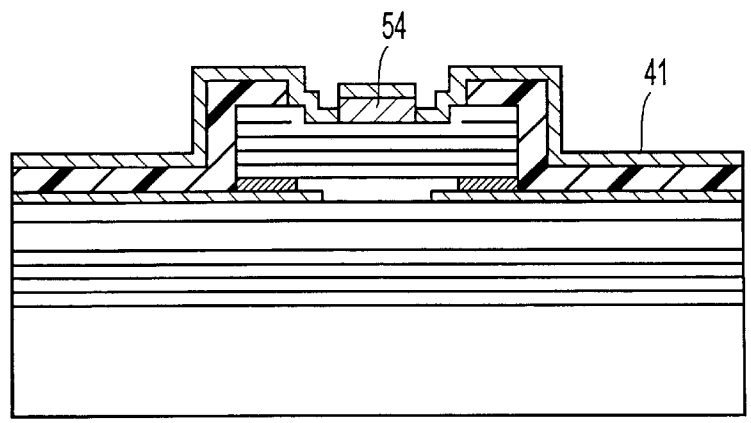
FIG. 16 is a cross sectional view for illustrating the manufacturing process of the surface emitting semiconductor laser in accordance with the third embodiment of the present invention.
Figure 17:
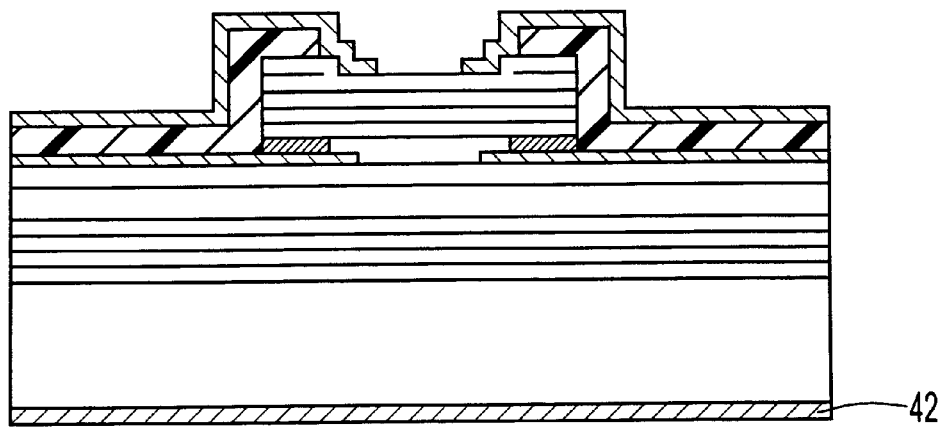
FIG. 17 is a cross sectional view for illustrating the manufacturing process of the surface emitting semiconductor laser in accordance with the third embodiment of the present invention.

FIG. 9(a) is a cross sectional view of a surface emitting semiconductor laser in accordance with the third embodiment. This embodiment has a structure composed of an n-type bottom multilayer reflection film 32, an undoped bottom spacer layer 33, a quantum well active layer 34 composed of an undoped quantum well layer and an undoped barrier layer, an undoped top spacer layer 35, an optical confinement layer 36 composed of an n-type or undoped semiconductor layer having an aperture 44 at the center, an AlAs insulation layer 37, formed by oxidization technique, having an aperture 45 (refer to FIG. 14 described hereinafter) having a diameter slightly larger than that of the aperture 44 of the optical confinement layer 36, a p-type top multilayer reflection film 38, and a p-type contact layer 39 which are laminated one on another on an n-type semiconductor substrate 31.

Figure 9B:
Figure 10:
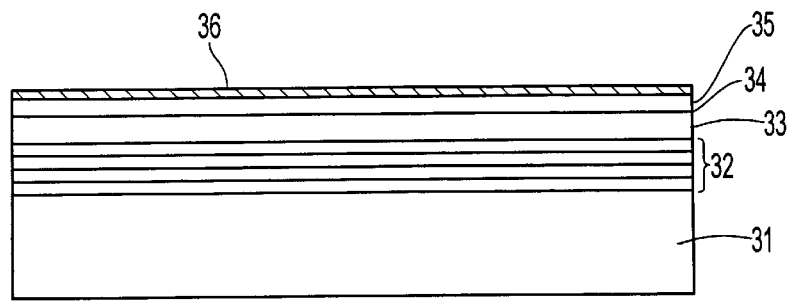
FIG. 10 is a cross sectional view for illustrating the manufacturing process of the surface emitting semiconductor laser in accordance with the third embodiment of the present invention.
Figure 11:
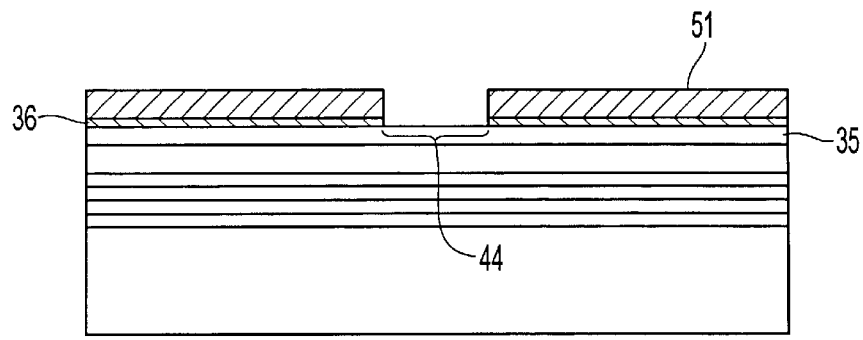
FIG. 11 is a cross sectional view for illustrating the manufacturing process of the surface emitting semiconductor laser in accordance with the third embodiment of the present invention.
Figure 12:
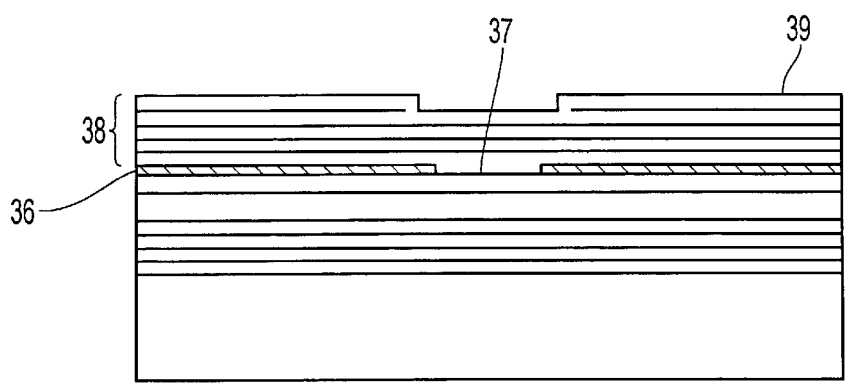
FIG. 12 is a cross sectional view for illustrating the manufacturing process of the surface emitting semiconductor laser in accordance with the third embodiment of the present invention.
Figure 13:
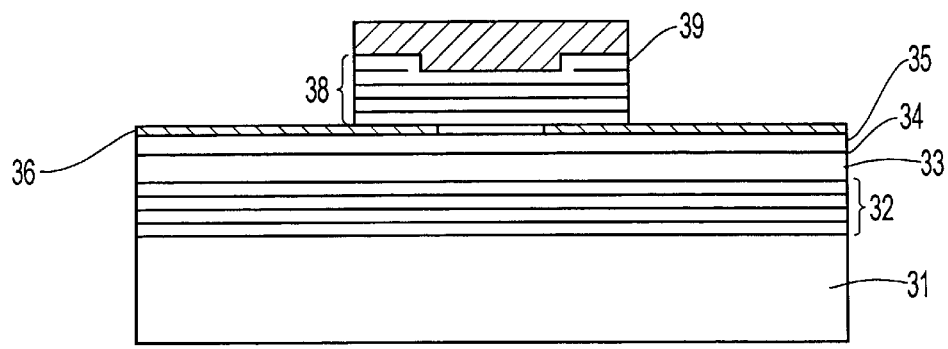
FIG. 13 is a cross sectional view for illustrating the manufacturing process of the surface emitting semiconductor laser in accordance with the third embodiment of the present invention.

In this embodiment as shown in FIG. 9(b), the structure has two step effective refractive index differences $\Delta n_1$ and $\Delta n_2$ between the inside area and the outside area of the two apertures 44 and 45 on the substrate horizontal plane, by prescribing the value of $\Delta n_2$ to be typically in a range from 0.01 to 0.02, preferably 0.015, and thus the ideal optical confinement condition is obtained.

The bottom multilayer reflection film 32 has the structure formed by laminating n-type $Al_{0.9}Ga_{0.1}As$ layers and n-type $Al_{0.3}Ga_{0.7}As$ layers each of which has a thickness of $\lambda/4n_r$ ($\lambda$ is oscillation wavelength, and $n_r$ is refractive index of the medium) alternately to the thickness of 40.5 periods, and the carrier concentration is $2\times10^{18}$ cm$^{-3}$ (dopant: silicon).

The quantum well active layer 34 has a laminated structure formed by combining alternately undoped $Al_{0.11}Ga_{0.89}As$ (film thickness 8 nm×3) and undoped $Al_{0.3}Ga_{0.7}As$ barrier layers (film thickness 5 nm×4), the total film thickness including from the bottom surface of the bottom spacer layer 33 to the top surface of the top spacer layer 35 is an integral multiple of $\lambda/n_r$ so that the standing wave is confined and so that so-called antinode of the light intensity is positioned at the quantum well active layer 34.

Though the optical confinement layer 36 consisting of an n-type or undoped semiconductor is a thin layer having a thickness of 100 nm or less, to reduce a loss due to light scattering around periphery of the aperture 44, the thickness of as thin as possible is preferable, and in this embodiment the optical confinement layer 36 having a thickness of 10 to 50 nm is used.

The top multilayer reflection film 38 has a structure formed by laminating p-type $Al_{0.9}Ga_{0.1}As$ layers and p-type $Al_{0.3}Ga_{0.7}As$ layers each of which has a thickness of $\lambda/4n_r$ alternately to the thickness of 30 periods, and the carrier concentration is $3\times10^{18}$ cm$^{-3}$ (dopant: carbon). An AlAs layer 39 of 100% Al is used as the lowermost layer instead of the $Al_{0.3}Ga_{0.1}As$ layer in order to perform selective oxidation later.

The p-type contact layer 38 has a thickness of 50 Å and the carrier concentration is $1\times10^{20}$ cm$^{-3}$ (dopant: carbon).

The reason why the number of periods (the number of layers) of the top multilayer reflection film 38 is smaller than that of the bottom multilayer reflection film 32 is that the emission light is emitted from the top surface of the substrate by differentiating in the reflectance. So-called graded layers having gradually varying Al composition ratio are provided between each $Al_{0.9}Ga_{0.1}As$ layer and $Al_{0.3}Ga_{0.7}As$ layer in the top semiconductor multilayer film 38 to reduce the series resistance of the element though it is not described in detail.

The surface emitting semiconductor laser in accordance with the third embodiment structured as described hereinabove emits a laser beam having an oscillation wavelength $\lambda$ of 780 nm from the top substrate surface.

Next, the manufacturing process of the surface emitting semiconductor laser in accordance with the third embodiment will be described.

FIG. 10 to FIG. 17 are cross sectional views for describing the manufacturing process of the surface emitting semiconductor laser in accordance with the third embodiment. First, on an n-type GaAs (100) substrate 31 a bottom multilayer reflection film 32 composed of n-type $Al_{0.9}Ga_{0.1}As$ layers and $Al_{0.3}Ga_{0.7}As$ layers, a bottom spacer layer 33 composed of an undoped $Al_{0.5}Ga_{0.5}As$ layer, a quantum well active layer 34 composed of undoped $Al_{0.11}Ga_{0.89}As$ quantum well layers and an undoped $Al_{0.3}Ga_{0.7}As$ barrier layers, a top spacer layer 35 composed of an undoped $Al_{0.5}Ga_{0.5}As$ layer, and an optical confinement layer 36 composed of an n-type or undoped GaInP layer are laminated one on another.

The semiconductor crystal growing technology using, for example, metalorganic chemical vapor deposition (MOCVD), is applied in this manufacturing process.

Next, the substrate is taken out from the growing chamber, a resist mask 51 having a circular aperture with a diameter of 3 to 10 $\mu$m$\phi$ is formed by applying photolithography. The optical confinement layer 36 consisting of n-type or undoped GaInP is etched and removed with an etchant containing phosphoric acid and hydrochloric acid until the top spacer layer 35 is exposed to form an aperture 44.

As shown in FIG. 21(a) to FIG. 21(e), the shape of the aperture 44 and aperture 45 maybe a circle, square, rectangle, ellipse, or rhomboid, and these shapes give the same effect. The planer shape of two-fold symmetry with respect to the substrate horizontal plane allows the plane of polarization of an emitted light to be controlled, and therefore the shape may be selected depending on the application.

The resist mask 51 is removed, the substrate is returned to the growing chamber again, a top multilayer reflection film 38 composed of p-type $Al_{0.9}Ga_{0.1}As$ layers and $Al_{0.3}Ga_{0.7}As$ layers, and a p-type GaAs contact layer 39 are deposited one on another.

Subsequently, the contact layer 39 and the top multilayer reflection film 38 are etched for removal using an etchant containing sulfuric acid and hydrogen peroxide to form a post shaped portion. Because it is known that the etching selectivity ratio is 10:1 or higher between AlGaAs base material, which is the composition of the top multilayer reflection film 38, and GaInP base material, which is the composition of the optical confinement layer 36, when an etching solution of, for example, $H_2SO_4:H_2O:H_2O_2=$ 1:10:100, is used, etching for forming the post shaped portion can be easily stopped at the optical confinement layer 36. Dry etching may be used to form the post shaped portion though etching using $BCl_3$ or $SiCl_4$ does not give as much etching selectivity as that of an etchant containing sulfuric acid and hydrogen peroxide.

In the event that the semiconductor layer happens to be removed until the top side of the active layer is exposed due to so-called over etching when the post shaped portion is formed by etching, the over etching leads to occurrence of a leak current which flows through the side when the current is supplied, the leak current results in increased non-emission re-combination and results in a reduced emission efficiency. From this view point, it is important to stop etching accurately at the position of the optical confinement layer 36 to prevent dispersion of the product quality and to prevent reduction of the production yield.

Further, the substrate having the contact layer 39 and the top multilayer reflection film 38 which are etched in the form of post shape is heat-treated in a quartz tube filled with steam at 400° C. for approximately 10 minutes. In the treatment, the exposed AlAs layer 37 is oxidized gradually from the outside, and an insulation area (selective oxidized layer) is formed on a part of the post shaped portion. The oxidation is controlled so as not to penetrate to the periphery of the aperture 44 in the optical confinement layer 36 in the direction horizontal to the substrate. The reason is that because the refractive index of the oxidized area is half or lower than the one of AlGaAs base material as described hereinabove, if the diameter of the area remained unoxidized is smaller than that of the aperture 44 formed in the optical confinement layer 36, effective refractive index difference becomes large, the mode becomes unstable, and light scattering loss increases.

The diameter of the area remained unoxidized is desirably larger than the diameter of the aperture 44 in the optical confinement layer 36 by 1 to 10 μm for good quality of the surface emission laser. If the diameter difference is smaller than this value, the smaller difference results in strong optical confinement effect and increased light scattering loss, on the other hand, if the diameter difference is larger than this value, the larger difference results in weak current narrowing and increased threshold current. Practically, it is important to select the optimal value in this difference range though the difference depends on the thickness of the optical confinement layer 36.

Next, a p-side electrode 41 which is provided with an aperture for emitting the light upward from the aperture 44 on the top surface, and an n-side electrode 42 are formed on the entire surface of the back surface of the substrate by applying photo-lithography, and thus the surface emitting semiconductor laser in accordance with the third embodiment shown in FIG. 9(a) is completed.

In the above-mentioned embodiment, the case in which GaInP is used for the optical confinement layer is described, however alternatively, the embodiment of the present invention is by no means limited to the case, any material may be used as long as it is a material having a refractive index with respect to the laser oscillation wavelength λ of the material which is a component of the spacer layer slightly smaller than the equivalent refractive index of the multilayer reflection film and as long as it is a material of lattice corresponding to the semiconductor substrate. For example, AlGaInP that is formed by adding aluminum to GaInP or zinc selenide (ZnSe) based material may be used.

Fourth Embodiment

Figure 18:
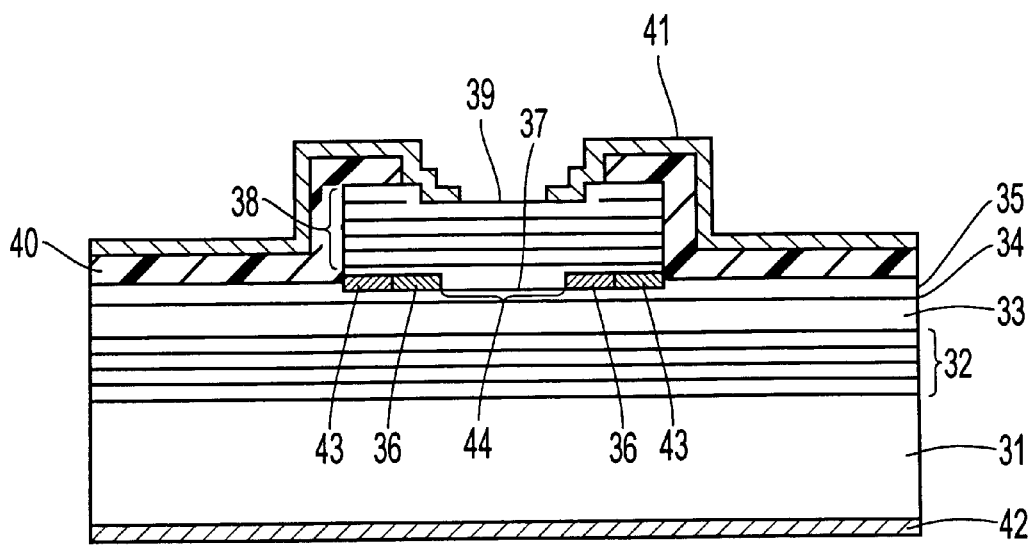
FIG. 18 is a cross sectional view of the surface emitting semiconductor laser in accordance with the fourth embodiment of the present invention.
Figure 19:
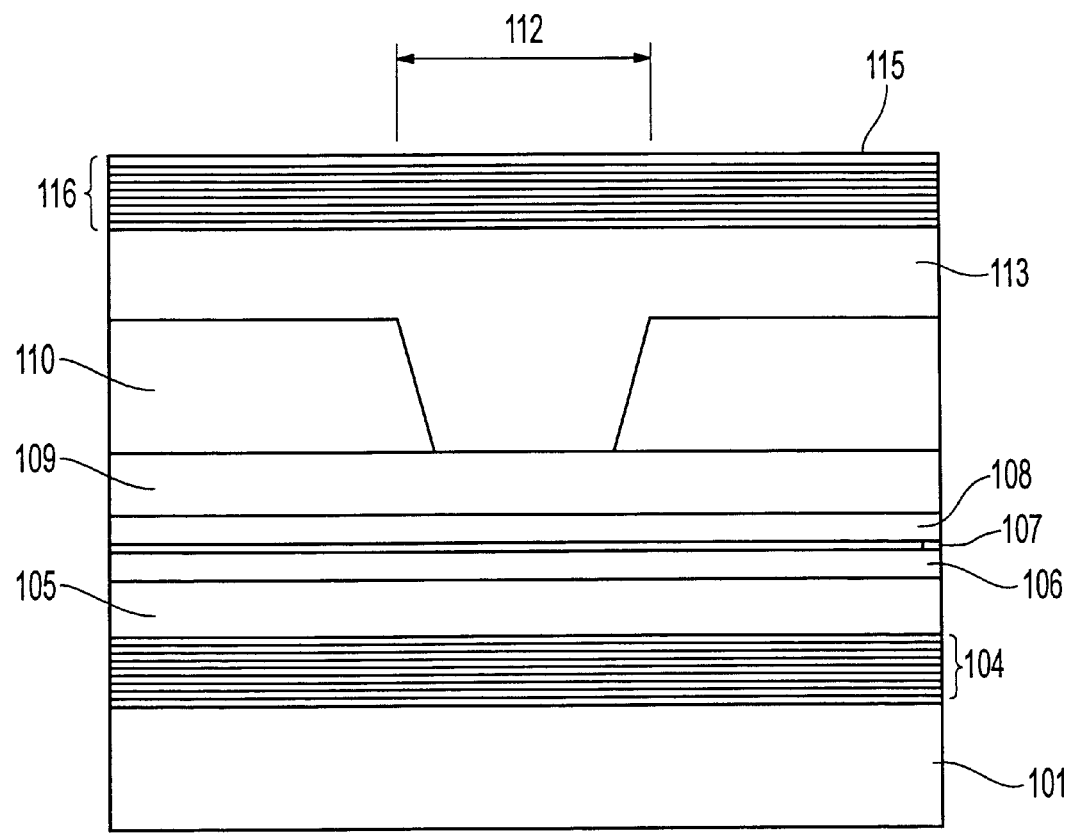
FIG. 19 is a cross sectional view of the surface emitting semiconductor laser in accordance with the conventional art.
Figure 20A:
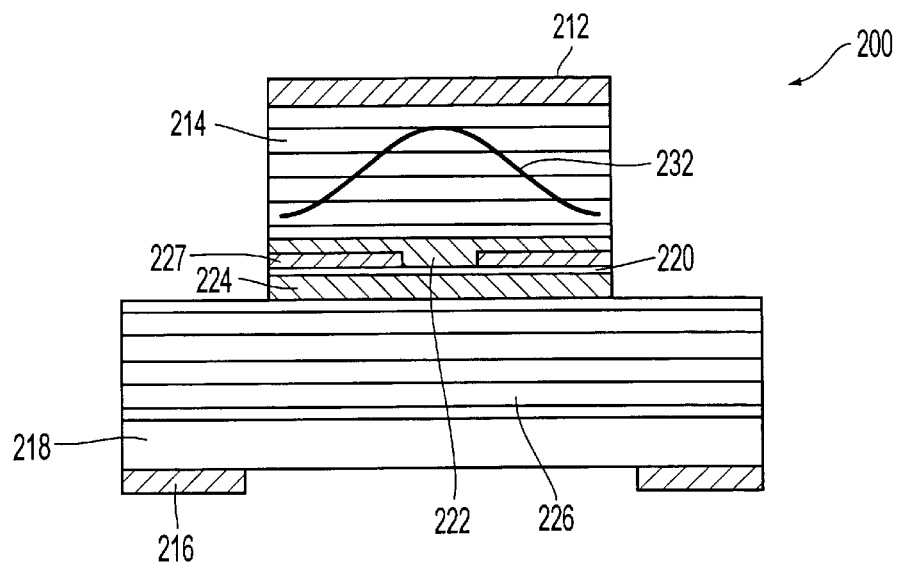
FIG. 20(a) and FIG. 20(b) are cross sectional views of the surface emitting semiconductor laser in accordance with the conventional art.
Figure 20B:
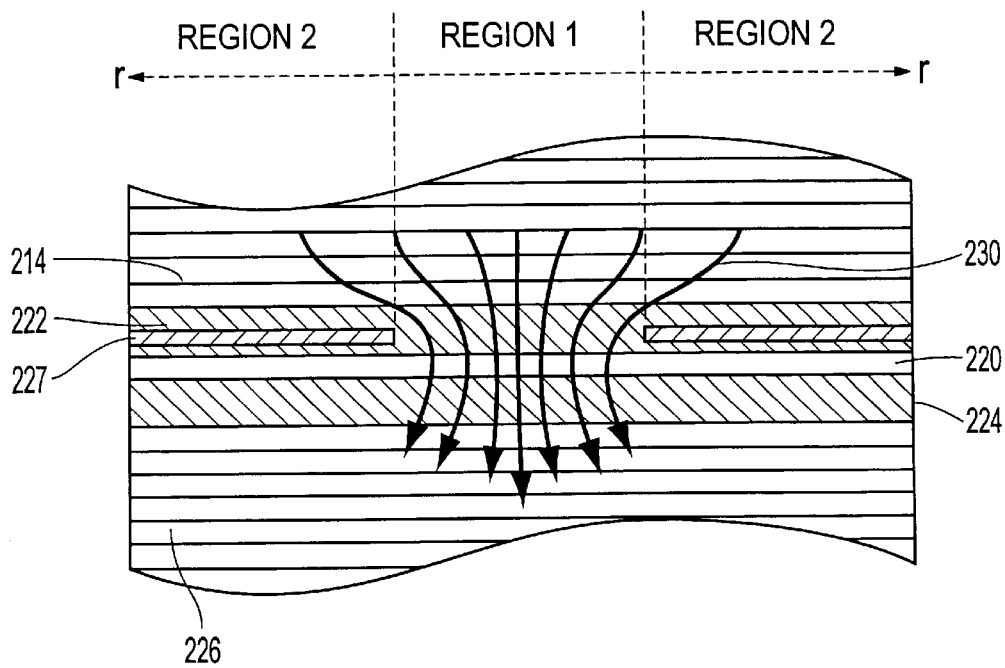
Figure 21A:
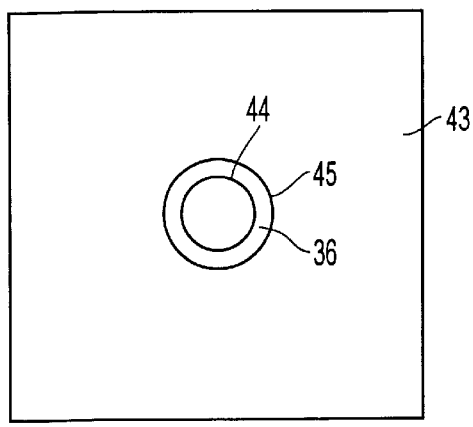
FIG. 21(a) to FIG. 21(e) are diagrams for illustrating the shape of the aperture (light emission area) provided on the optical confinement layer of the planer type surface emitting semiconductor laser in accordance with the third or fourth embodiment of the present invention.
Figure 21B:
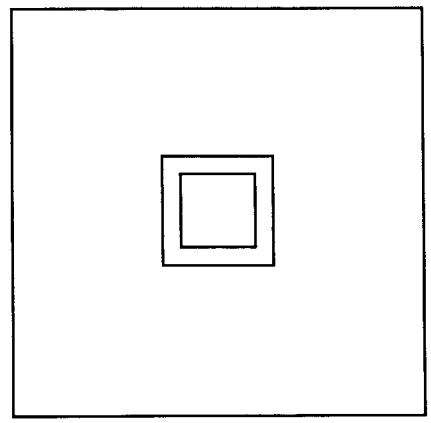
Figure 21C:
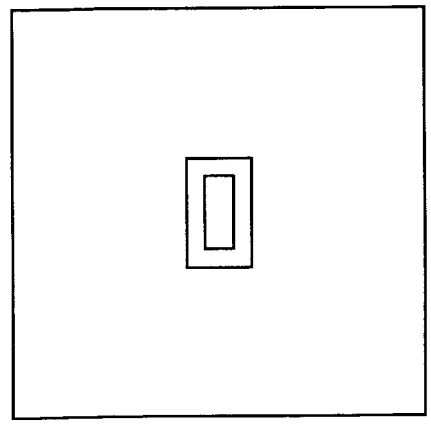
Figure 21D:
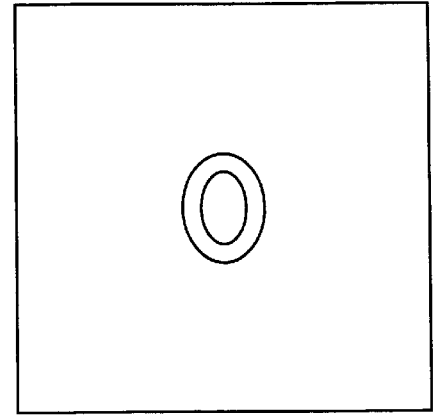
Figure 21E:
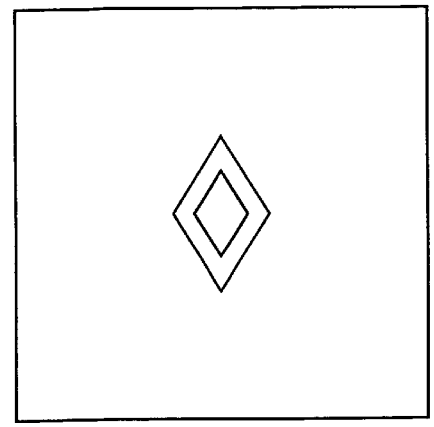

FIG. 18 is a cross sectional view for illustrating a surface emitting semiconductor laser in accordance with the fourth embodiment. In this embodiment, a simple structure in which AlGaInP is used as a material for the optical confinement layer and this layer also serves as the selectively oxidized layer is applied.

The lamination structure of this surface emitting laser is different from that of the third embodiment in that the lowermost layer of the top multilayer reflection film 38 is not replaced with an AlAs layer and the material of the optical confinement layer 36 consists of AlGaInP (including AlInP, namely Ga composition is zero) which is formed by adding aluminum to GaInP.

In this embodiment, to obtain a desired aperture shape, the processed optical confinement layer 36 is oxidized from the periphery to form an insulation area (selective oxidized layer) 43. Similarly to the third embodiment, oxidation is controlled so as not to penetrate to the periphery of the aperture 44 in the optical confinement layer 36 in the direction horizontal to the substrate.

According to this embodiment, the lamination structure of the top multilayer reflection film 38 can be formed of two types of material having two different Al compositions and the optical confinement layer 36 also serves as a current narrowing layer, and as the result the structure of the surface emitting laser is simplified.

In this embodiment, the case that p-type semiconductor is used for the top multilayer reflection film 38 and n-type semiconductor is used for the bottom multilayer reflection film 32 is described, however, the present invention is by no means limited to the case, and alternatively n-type and p-type may be reversed. In general, a p-type layer is apt to increase the element resistance due to band discontinuity in comparison with an n-type layer, therefore increased number of layers is not preferable because it causes laser quality deterioration. In this embodiment, the number of layers of the top multilayer reflection film is larger than that of the bottom multilayer reflection film because the outgoing light is emitted from the top surface of the substrate. Though p-type conduction is used for the top multilayer reflection film in this embodiment, it is desirable to use n-type conduction alternatively for the top multilayer reflection film, which has a larger number of layers in the case that outgoing light is emitted from the back surface of the substrate.

From the different view point, the element resistance is inversely proportional to the area, therefore in the case that, for example, the top multilayer reflection film is shaped in the form of post shape, the top multilayer reflection film leads to high element resistance. It is preferable that n-type is used for the top multilayer reflection film because n-type bring about the reduced element resistance smaller than p-type as long as both layers have the same area. It is required to determine the conduction type from the total view point with consideration for light outgoing direction and element resistance difference de to conduction type.

In the embodiments described hereinbefore, the case that GaAs/Al semiconductor is used as a material for forming the quantum well active layer is described, however, the present invention is by no means limited to the case, and alternatively, for example, GaAnGaAs base and InP/InGaAsP base semiconductors may be used for the quantum well active layer. The emission wavelength λ emitted from the quantum well layer is transparent to a GaAs substrate, in this case emission light is taken out easily from the back surface of the substrate, and the manufacturing process is simplified.

The case that MOCVD is used as a crystal growing method is described, however, the present invention is by no means limited to the case, and alternatively, for example, the same semiconductor film can be obtained using molecular beam epitaxy (MBE).

The case that a heating temperature of 400° C. is used for selective oxidation of the AlAs layer is described, however, the present invention is by no means limited to the case, and alternatively, any condition may be used as long as it is suitable for controlling desirably the final size of a current passage. The oxidation rate increases with increasing temperature for selective oxidation, and a desired oxidized area is formed within a short time but it has been confirmed experimentally that oxidation distance is easily controlled around the temperature of 400° C.

The case that selective oxidation is used to form the aperture is described, however, the present invention is by no means limited to the case, and alternatively, for example, selective etching may be applied. Because the refractive index of a space formed by etching is 1, the refractive index is lower than that in the case of oxidation, the optical confinement effect of this portion is more strong, and insulation is more excellent.

Further alternatively, an optical confinement layer having an aperture may be deposited using, for example, semiconductor crystal selective growing technique. In this case, in one method, the substrate is taken out from the growing chamber when the top multilayer reflection film is deposited, a silicon base insulation film is deposited on the top surface of the top multilayer reflection film. After patterning of it in the form of desired shape, the substrate is returned to the inside of the growing chamber again, an optical confinement layer is formed by selective growing using the substrate as a mask. Because a film formed on the mask is removed very easily together with the mask, an aperture is easily formed thereby in the optical confinement layer.

Another method is known in which a top multilayer reflection film is deposited using the above-mentioned MBE, a circular metal mask with a diameter of approximately 10 $\mu$m is provided in the growing chamber, an evaporation material is then evaporated from a cell containing it, molecular beam irradiated onto the substrate surface is shielded, and a semiconductor layer is deposited for growing selectively only on the area where a mask is not used. This method is called as mask MBE method and a crystal growing technique, which is expected to be applied in manufacturing process of optical semiconductor devices in the future.

The present invention is by no means limited to the above-mentioned embodiments, however alternatively, other structures may be applied as long as the structure satisfies the constitutional condition of the present invention. For example, in the embodiments described hereinabove, the optical confinement layer is provided on the light emission side, however alternatively it is possible to obtain the same effect by providing the optical confinement layer on the opposite side because the refractive index is changed significantly.

Figure 22:
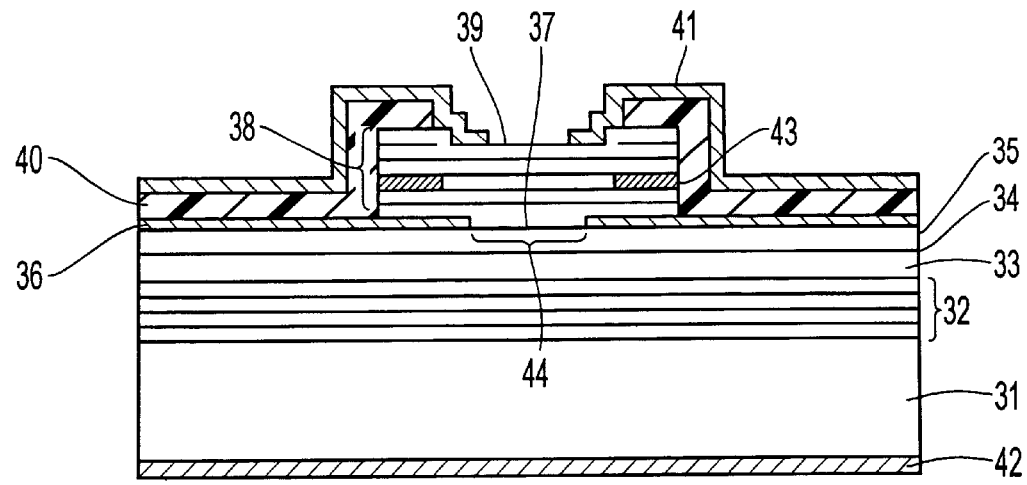
FIG. 22 is a cross sectional view of the surface emitting semiconductor laser in accordance with another embodiment of the present invention.
Figure 23:
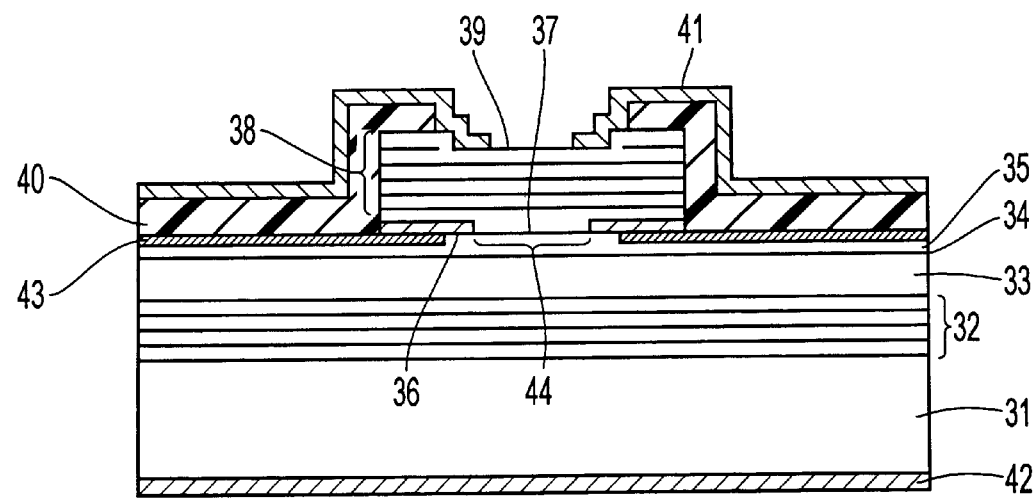
FIG. 23 is a cross sectional view of the surface emitting semiconductor laser in accordance with another embodiment of the present invention.
Figure 24:
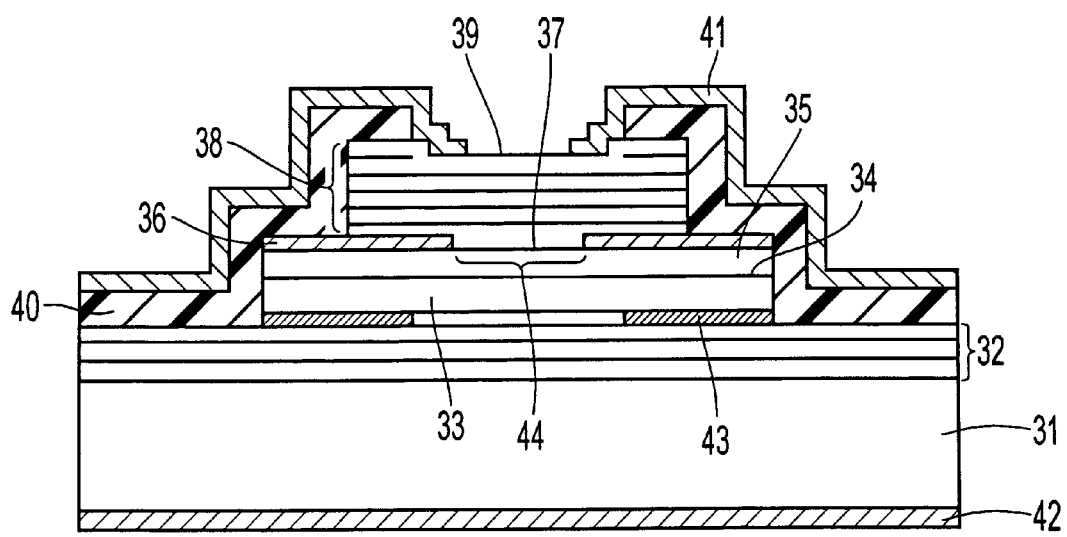
FIG. 24 is a cross sectional view of the surface emitting semiconductor laser in accordance with another embodiment of the present invention.

In the case that a selective oxidized layer for current narrowing is provided on a layer different from the optical confinement layer, the selective oxidized layer is provided on a portion of the reflection film adjacent to the optical confinement layer in the above-mentioned embodiments, however, the selective layer is not necessarily provided at the position adjacent to the reflection film side of the optical confinement layer, and alternatively the selective oxidized layer may be adjacent to the active layer side as shown in FIG. 22, and further alternatively the selective oxidized layer may be provided at the position apart from the optical confinement layer as shown in FIG. 23. Still further alternatively, the same effect is obtained by providing the selective oxidized layer facing to the optical confinement layer with interposition of the active layer as shown in FIG. 24.

As described hereinbefore, in the surface emitting semiconductor laser in accordance with the present invention, because the surface emitting semiconductor laser having a structure that top and bottom spacer layers are formed on both sides of an active layer and top and bottom reflection layers are formed on the top side of the top spacer layer and the bottom side of the bottom spacer layer respectively is provided with optical confinement layers provided on one or both contact surfaces between the top and bottom spacer layers and the top and bottom reflection films, wherein the optical confinement layers comprise a semiconductor layer having a thickness of 100 nm or less formed on the entire surface excepting the light emission area, which layers consist of a material having a lattice constant similar to the one of the material of the top and bottom spacer layer and the one of the material of the top and bottom reflection films and having the refractive index slightly smaller than the effective refractive index of the material of the top and bottom spacer layers and the material of the top and bottom reflection films, and thus the surface emitting semiconductor laser whose transverse mode is stable, the threshold current is small, and the output is high is provided.

Because the light scattering loss is reduced by separating the function into optical confinement and current narrowing, optical confinement function is allocated to the optical confinement layer which uses a semiconductor material having a suitable refractive index and having a lattice constant corresponding to the one of the semiconductor substrate, current narrowing function is allocated to the layer which is formed by selective oxidation to make the semiconductor be insulator or allocated to the etching layer, the threshold current is further reduced more while the transverse mode of the surface emitting semiconductor laser is maintained stable, and further the laser is oscillated more efficiently.

Because the optical confinement layer also serves as the current narrowing layer due to the structure formed by oxidizing the optical confinement layer from the periphery to form the selectively oxidized layer, the structure is simplified.

Because any one of or both shapes of areas, one is the light emission area composed of an aperture provided in the optical confinement layer and the other is the oxidized area, are two fold symmetrical geometric shaped with respect to the horizontal plane of the substrate, the polarization plane of the laser beam is controlled in a certain desired direction.

What is claimed is:
1. A surface emitting semiconductor laser having a structure that top and bottom spacer layers are formed on both sides of an active layer and top and bottom reflection layers are formed on the top side of the top spacer layer and the bottom side of the bottom spacer layer respectively,
  wherein said surface emitting semiconductor laser has optical confinement layers provided on one or both contact surfaces between said top and bottom spacer layers and said top and bottom reflection films, and
  said optical confinement layers comprise a semiconductor layer having a thickness of 100 nm or less formed on the entire surface excepting the light emission area, said semiconductor layer consists of a material having a lattice constant similar to the one of the material of said top and bottom spacer layers and the one of the material of said top and bottom reflection films and having the refractive index smaller than the effective refractive index of the material of said top and bottom spacer layers and the material of said top and bottom reflection films.

2. The surface emitting semiconductor laser as claimed in claim 1, wherein the effective refractive index difference between the light emission area inside said optical confinement layer and the peripheral area of the light emission area including said optical confinement layer is in a range from 0.01 to 0.02 in the horizontal plane along said active layer.

3. The surface emitting semiconductor laser as claimed in claim 1, wherein the thickness of said optical confinement layers is in a range from 10 to 50 nm.

4. The surface emitting semiconductor laser as claimed in claim 1, wherein said optical confinement layer is a single quantum well layer or multilayer quantum well layer of undoped AlGaAs base material, said top and bottom spacer layers are semiconductor layers of undoped AlGaAs base material having a forbidden band width larger than the one of said active layer, said top and bottom reflection films are semiconductor layers of AlGaAs base material which top and bottom layers have different conduction types respectively, and said optical confinement layers are semiconductor layers of GaInP base material having a refractive index slightly smaller than the one of said spacer layers.

5. A surface emitting semiconductor laser having a structure that top and bottom spacer layers are formed on both sides of an active layer and top and bottom reflection layers are formed on the top side of the top spacer layer and the bottom side of the bottom spacer layer respectively,
wherein said surface emitting semiconductor laser has optical confinement layers provided on one or both contact surfaces between said top and bottom spacer layers and said top and bottom reflection films,
said optical confinement layers which comprise semiconductor layers consisting of a material having a lattice constant similar to the one of the material of said top and bottom spacer layer and the one of the material of said top and bottom reflection films and having the refractive index slightly smaller than the effective refractive index of the material of said top and bottom spacer layers and the material of said top and bottom reflection films, are formed on the entire surface excepting the light emission area, and
in the horizontal plane along said active layer, effective refractive index differences of at least two steps are provided between the light emission area inside said optical confinement layer and the peripheral area of the light emission area.

6. A surface emission semiconductor laser as claimed in claim 5, wherein the layer adjacent to said active layer is partially oxidized, and the end of said layer is oxidized from the side to form an insulation portion so that oxidation does not penetrate to at least the periphery of said light emission area on the horizontal plane of the substrate.

7. The surface emitting semiconductor laser as claimed in claim 6, wherein the refractive index of the material of said optical confinement layers is larger than the refractive index of the material of a portion of the layer adjacent to said active layer which portion is the oxidized area.

8. The surface emitting semiconductor laser as claimed in claim 6, wherein the layer which is adjacent to said active layer and which is oxidized is a portion of said reflection film, and consists of an aluminum-gallium-arsenic layer containing percentage composition of 90% or higher.

9. The surface emitting semiconductor laser as claimed in claim 6, wherein the layer which is adjacent to said active layer and which is oxidized is provided on the side which is facing to said optical confinement layer with interposition of said active layer.

10. The surface emitting semiconductor laser as claimed in claim 1, wherein one of said top and bottom reflection films is formed in post shape on said light emission area.

11. The surface emitting semiconductor laser as claimed in claim 10, wherein the etching rate of the material of said reflection film is larger than the etching rate of the material of said optical confinement layer.

12. The surface emitting semiconductor laser as claimed in claim 5, wherein the effective refractive index difference between said light emission area and the area outside said light emission area is in a range from 0.01 to 0.02.

13. The surface emitting semiconductor laser as claimed in claim 5, wherein the thickness of said optical confinement layer is 100 nm or less.

14. The surface emitting semiconductor laser as claimed in claim 6, wherein any one of or both shapes of area, one is the light emission area formed on said optical confinement layer and the other is the oxidized area which is a portion of the layer adjacent to said active layer or a portion of said optical confinement layer, are two fold symmetrical shaped with respect to the layer plane.

15. A surface emitting semiconductor laser having a structure that top and bottom spacer layers are formed on both sides of an active layer and top and bottom reflection layers are formed on the top side of the top spacer layer and the bottom side of the bottom spacer layer respectively,
wherein said surface emitting semiconductor laser has optical confinement layers provided on one or both contact surfaces between said top and bottom spacer layers and said top and bottom reflection films,
said optical confinement layers comprise a semiconductor layer having a thickness of 100 nm or less formed on the entire surface excepting the light emission area, said layers consist of a material having a lattice constant similar to the one of the material of said top and bottom spacer layer and the one of the material of said top and bottom reflection films and having the refractive index slightly smaller than the effective refractive index of the material of said top and bottom spacer layers and the material of said top and bottom reflection films, and
a portion of said optical confinement layer is oxidized, and the end of said portion is oxidized from the side to form an insulation portion so that oxidation does not penetrate to at least the periphery of said light emission area on the horizontal plane of the substrate.

16. The surface emitting semiconductor laser as claimed in claim 15, wherein the refractive index of the material of said optical confinement layer is larger than the refractive index of the material of the area which is a portion of said optical confinement layer and which is oxidized.

17. The surface emitting semiconductor laser as claimed in claim 16, wherein the material of said optical confinement layer is aluminum-gallium-indium-phosphor base compound containing at least gallium-indium-phosphor.

18. The surface emitting semiconductor laser as claimed in claim 15, wherein either said top or bottom reflection films is formed in post shape on said light emission area.

19. The surface emitting semiconductor laser as claimed in claim 18, wherein the etching rate of the material of said reflection film and said optical confinement layer is larger than the etching rate of the material of the spacer layer adjacent to said optical confinement layer.

20. The surface emitting semiconductor laser as claimed in claim 15, wherein any one of or both shapes of area, one is the light emission area formed on said optical confinement layer and the other is the oxidized area which is a portion of the layer adjacent to said active layer or a portion of said optical confinement layer, are two fold symmetrical geometric shaped with respect to the layer plane.

21. The surface emitting semiconductor laser as claimed in claim 15, wherein a portion of the layer adjacent to said active layer or said optical confinement layer is removed by etching instead of oxidation.

* * * * *